(12) United States Patent
Yi et al.

(10) Patent No.: US 10,861,987 B2
(45) Date of Patent: Dec. 8, 2020

(54) METHOD FOR MANUFACTURING SELECTIVE EMITTER USING SURFACE STRUCTURE AND SOLAR CELL INCLUDING SELECTIVE EMITTER USING SURFACE STRUCTURE

(71) Applicant: Research & Business Foundation Sungkyunkwan University, Suwon-si (KR)

(72) Inventors: Junsin Yi, Seoul (KR); Minkyu Ju, Suwon-si (KR); Young-Hyun Cho, Suwon-si (KR); Eun-Chel Cho, Yongin-si (KR); Youngkuk Kim, Suwon-si (KR); Kumar Mallem, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/563,118

(22) Filed: Sep. 6, 2019

(65) Prior Publication Data
US 2020/0135944 A1 Apr. 30, 2020

(30) Foreign Application Priority Data
Oct. 30, 2018 (KR) .......................... 10-2018-0130398

(51) Int. Cl.
*H01L 31/0236* (2006.01)
*H01L 31/18* (2006.01)
(Continued)

(52) U.S. Cl.
CPC ...... *H01L 31/02363* (2013.01); *H01L 31/068* (2013.01); *H01L 31/1804* (2013.01)

(58) Field of Classification Search
CPC ......... H01L 31/02363; H01L 31/02366; H01L 31/0236; H01L 31/1804; H01L 31/186;
(Continued)

(56) References Cited

U.S. PATENT DOCUMENTS 6,313,397 B1 * 11/2001 Washio ............... H01L 31/0236
136/256
2005/0087226 A1 * 4/2005 Nishida ........... H01L 31/022425
136/256
(Continued)

FOREIGN PATENT DOCUMENTS

KR 10-1680384 B1 11/2016
KR 10-2018-0098116 A 9/2018

*Primary Examiner* — Errol V Fernandes
*Assistant Examiner* — Jeremy J Joy
(74) *Attorney, Agent, or Firm* — NSIP Law

(57) ABSTRACT

Proposed is a method for manufacturing a selective emitter using a surface structure, the method includes: preparing a wafer; forming fine first surface unevenness in each of front and rear faces of the wafer; forming a texturing-inhibiting film on each of the front and rear faces of the wafer; partially patterning the front texturing-inhibiting film to expose a portion of the front face of the wafer; forming second surface unevenness in the exposed portion of the wafer, wherein the second surface unevenness has a roughness greater and deeper than a roughness of the first surface unevenness; removing the texturing-inhibiting films; and forming a selective emitter on a surface of the wafer having the first surface unevenness and the second surface unevenness defined therein using a doping process.

11 Claims, 9 Drawing Sheets

(51) Int. Cl.
*H01L 31/068* (2012.01)
*H01L 31/0224* (2006.01)
*H01L 31/042* (2014.01)

(58) Field of Classification Search
CPC ............... H01L 31/1868; H01L 31/068; H01L 31/022425; H01L 31/042
See application file for complete search history.

(56) References Cited

U.S. PATENT DOCUMENTS

| | | | |
|---|---|---|---|
| 2011/0265870 A1* | 11/2011 | Park | H01L 31/1804 136/256 |
| 2012/0090673 A1* | 4/2012 | Dimitrov | H01L 31/068 136/255 |
| 2012/0111396 A1* | 5/2012 | Saylor | H01L 31/068 136/255 |
| 2013/0048073 A1* | 2/2013 | Karakida | H01L 31/1804 136/256 |
| 2013/0247965 A1* | 9/2013 | Swanson | H01L 31/068 136/252 |
| 2013/0276860 A1* | 10/2013 | Karakida | H01L 31/068 136/244 |
| 2014/0020752 A1* | 1/2014 | Arimoto | H01L 31/0747 136/256 |
| 2014/0299187 A1* | 10/2014 | Chang | H01L 31/02167 136/258 |
| 2015/0270425 A1* | 9/2015 | Jeong | H01L 31/035227 136/255 |
| 2017/0012148 A1* | 1/2017 | Lee | H01L 31/022425 |
| 2017/0301805 A1* | 10/2017 | Yamarin | H01L 31/035281 |
| 2018/0315866 A1* | 11/2018 | Cheong | H01L 31/02363 |
| 2019/0305149 A1* | 10/2019 | Watabe | H01L 31/022425 |

\* cited by examiner

METHOD FOR MANUFACTURING SELECTIVE EMITTER USING SURFACE STRUCTURE AND SOLAR CELL INCLUDING SELECTIVE EMITTER USING SURFACE STRUCTURE

CROSS-REFERENCE TO RELATED APPLICATION

This application claims a benefit under 35 U.S.C. § 119(a) of Korean Patent Application No. 10-2018-0130398 filed on Oct. 30, 2018, in the Korean Intellectual Property Office, the entire disclosure of which is incorporated herein by reference for all purposes.

BACKGROUND

1. Field

The present disclosure relates to a method for manufacturing a selective emitter using a surface structure, and further to a solar cell including a selective emitter produced by the method for manufacturing the selective emitter using the surface structure.

2. Description of Related Art

General selective emitter (SE) techniques cause some problems in a solar cell manufacturing process. A dopant paste and silicon inkjet SE technique applied prior to a doping process may be easily exposed to contamination and thus carry a risk of diffusion of contaminants into silicon in a hot doping process.

Laser doping applied after the doping process results in damage to the silicon surface. Surface etch-back or etch paste techniques cause loss of reflectivity caused by etching of a light absorbing surface.

Further, SE technique using a masking layer together with laser ablation prior to the doping process causes surface damage and sheet resistance non-uniformity. Further, most of SE techniques cause over alignment for alignment in a front electrode printing process.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a selective emitter and a high efficiency solar cell using the same in which there are no problems such as contamination and surface damage, loss of reflectivity, doping nonuniformity, etc. in a doping process, and, structurally over alignment and shadow losses for alignment of a front printed electrode are minimized.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In a first aspect, the present disclosure proposes a method for manufacturing a selective emitter using a surface structure, the method includes: preparing a wafer; forming fine first surface unevenness in each of front and rear faces of the wafer; forming a texturing-inhibiting film on each of the front and rear faces of the wafer; partially patterning the front texturing-inhibiting film to expose a portion of the front face of the wafer; forming second surface unevenness in the exposed portion of the wafer, wherein the second surface unevenness has a roughness greater and deeper than a roughness of the first surface unevenness; removing the texturing-inhibiting films; and forming a selective emitter on a surface of the wafer having the first surface unevenness and the second surface unevenness defined therein using a doping process.

In one implementation of the first aspect, forming the selective emitter includes implanting a conductive impurity having a conduction type opposite to a conduction type of the wafer.

In one implementation of the first aspect, forming the first surface unevenness includes using at least one of plasma treatment, laser scribing, scratching, or acid or base treatment.

In one implementation of the first aspect, forming the second surface unevenness includes using at least one of plasma treatment, laser scribing, scratching, or acid or base treatment.

In a second aspect, the present disclosure proposes a solar cell having a selective emitter, wherein the selective emitter is formed according to the method as defined above.

In a third aspect, the present disclosure proposes a method for manufacturing a solar cell including a selective emitter using a surface structure, the method including: exposing a wafer to chemical etching vapor to form fine first surface unevenness on each of front and rear faces of the wafer; forming a texturing-inhibiting film on each of the front and rear faces of the wafer; partially patterning the front texturing-inhibiting film to expose a portion of the front face of the wafer; forming second surface unevenness in the exposed portion of the wafer using an etching process, wherein the second surface unevenness has a roughness greater and deeper than a roughness of the first surface unevenness; removing the texturing-inhibiting films; forming a selective emitter on a surface of the wafer having the first surface unevenness and the second surface unevenness defined therein using a doping process; forming an anti-reflection film on the front face; forming a passivation film on each of the front and rear faces; and forming a front electrode and a rear electrode.

In one implementation of the third aspect, forming the selective emitter includes implanting a conductive impurity having a conduction type opposite to a conduction type of the wafer.

In one implementation of the third aspect, forming the first surface unevenness includes using at least one of plasma treatment, laser scribing, scratching, or acid or base treatment.

In one implementation of the third aspect, forming the second surface unevenness includes using at least one of plasma treatment, laser scribing, scratching, or acid or base treatment.

In one implementation of the third aspect, the method further includes forming a rear electric field layer on the rear face.

In one implementation of the third aspect, the front electrode contacts the first surface unevenness.

In the selective emitter manufacturing method in accordance with the present disclosure, low sheet resistance and high sheet resistance are selectively formed. Thus, at the low sheet resistance, FF may be improved with low contact resistance with electrodes. At high sheet resistance, low surface recombination properties improve $J_{SC}$ and $V_{OC}$. This improves solar cell efficiency.

In particular, the present selective emitter (SE) technique does not have problems such as contamination and surface damage, reflectance loss, doping unevenness, and, structurally, at the same time, minimizes the loss of over alignment for alignment of the front printed electrode.

It is to be understood that both the foregoing general description and the following detailed description of the preferred embodiments of the present invention are exemplary and explanatory and are intended to provide further explanation of the invention as claimed.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1:
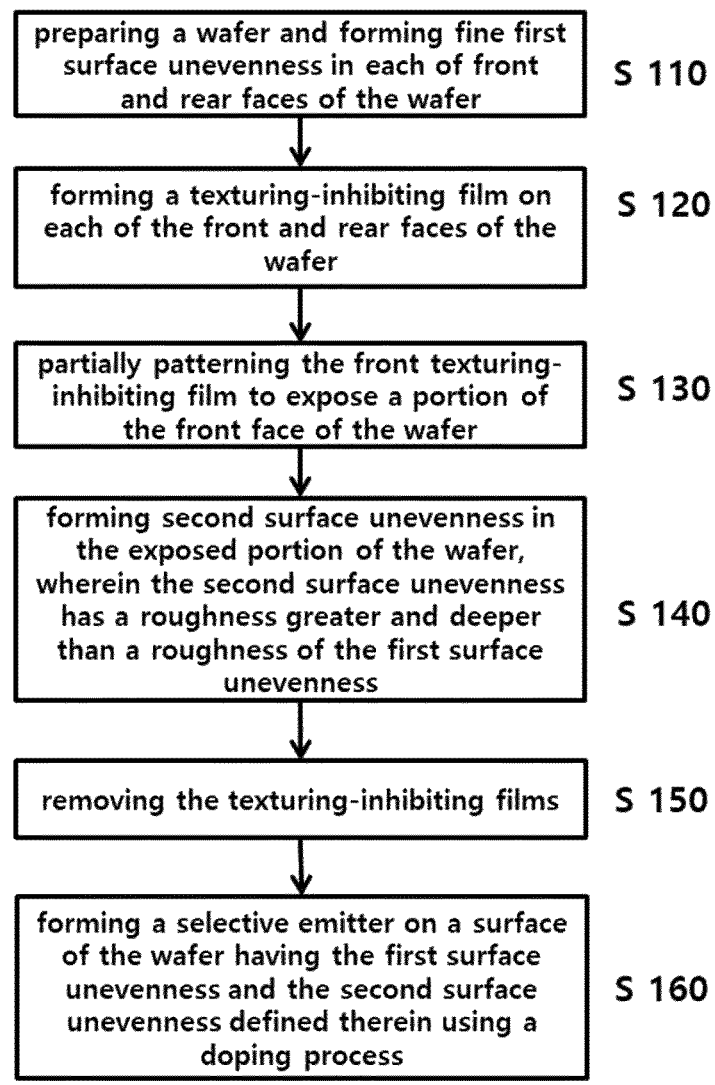
FIG. 1 shows a flowchart of a method for manufacturing a selective emitter using a surface structure according to an embodiment of the present disclosure.

For simplicity and clarity of illustration, elements in the figures. are not necessarily drawn to scale. The same reference numbers in different figures. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

The present selective emitter (SE) technique selectively forms low sheet resistance and high sheet resistance. Thus, at the low sheet resistance, FF may be improved with low contact resistance with electrodes. At high sheet resistance, low surface recombination properties improve $J_{SC}$ and $V_{OC}$. This improves solar cell efficiency.

A purpose of the present disclosure is to provide a selective emitter and a high efficiency solar cell using the same in which there are no problems such as contamination and surface damage, loss of reflectivity, doping nonuniformity, etc. in a doping process, and, structurally over alignment and shadow losses for alignment of a front printed electrode are minimized.

The present disclosure develops and proposes a new selective emitter technique using nanostructures that improves the shortcomings of the conventional general selective emitter techniques as mentioned in the prior art. Silicon nanostructures exhibit different sheet resistances and doping depth changes depending on surface shapes and doping process conditions. Using this phenomenon, the present disclosure proposes a new selective emitter technique that forms nanostructures for low sheet resistance of the selective emitter prior to texturization and controls change of sheet resistance using the doping process.

FIG. 1 shows a flowchart of a method for manufacturing a selective emitter using a surface structure according to an embodiment of the present disclosure. FIG. 2a to FIG. 2e show a schematic diagram of a method for manufacturing a selective emitter using a surface structure according to an embodiment of the present disclosure.

According to an embodiment of the present disclosure, a method for manufacturing a selective emitter using a surface structure includes: preparing a wafer and forming fine first surface unevenness in front and rear faces of the wafer (S 110); forming a texturing-inhibiting film on each of the front and rear faces of the wafer (S 120); patterning the front texturing-inhibiting film to expose a portion of the wafer (S 130); forming a second surface unevenness greater and deeper than the first surface unevenness in the exposed portion of the wafer (S 140); removing the texturing-inhibiting films (S 150); and forming a selective emitter on the surface of the wafer including the first surface unevenness and the second surface unevenness using a doping process (S 160).

Figure 2A:
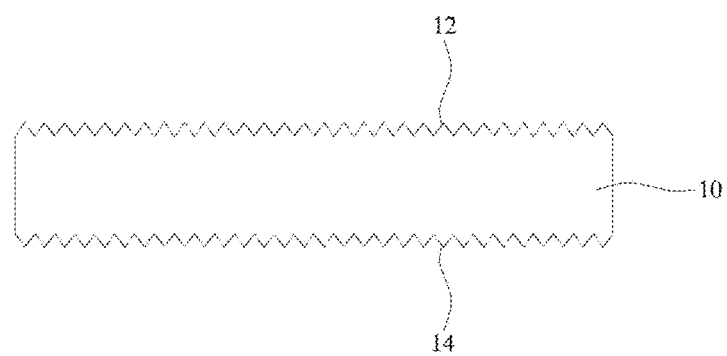
FIG. 2a to FIG. 2e show a schematic diagram of a method for manufacturing a selective emitter using a surface structure according to an embodiment of the present disclosure.

In step S 110, a wafer is prepared and fine first surface unevenness is formed in the front and rear faces of the wafer. As shown in FIG. 2a, fine unevenness 12 and 14 may be formed on both the front and back surfaces of the wafer 10, respectively.

As the wafer 10, a silicon wafer is preferably used. A single crystal, a polycrystalline silicon wafer, or an amorphous silicon wafer may be used. The prepared wafer may be a substrate in which saw damage generated on the surface of the silicon wafer during the silicon ingot slicing process by a pretreatment process is removed by wet-etching process. The silicon wafer 10 may be formed of a silicon material having one of n-type semiconductor characteristics and p-type semiconductor characteristics to form a PN junction. For example, when the silicon wafer 10 has n-type semiconductor properties, pentavalent elements such as phosphorus (P), arsenic (As), antimony (Sb), and the like may be doped. In the case of having a p-type semiconductor property, trivalent elements such as boron (B), gallium (Ga), and phosphorus (In) may be doped.

The first surface unevenness is formed on each of the front and back of the substrate. The unevenness may be formed by any one of plasma treatment for irradiating plasma, laser scribing to generate defects with adjusting energy levels, scratching forming scratches with fine tips, and acid or base treatment. This first surface unevenness is formed uniformly finely. Compared to the second surface unevenness described later, a size of the unevenness of the first surface unevenness is smaller and a specific surface area thereof is larger.

Figure 2B:
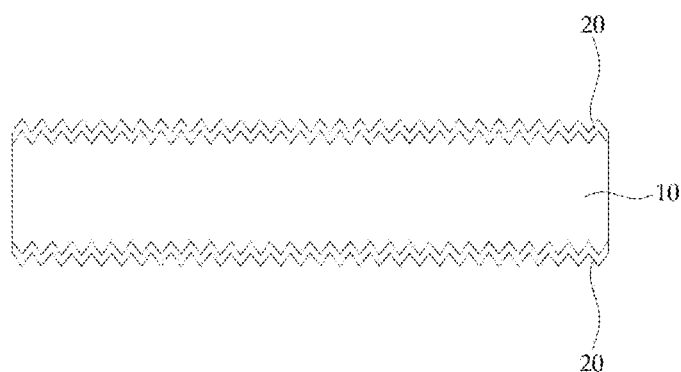

In step S 120, a texturing-inhibiting film is formed on each of the front and rear faces of the wafer. As shown in FIG. 2b, a texturing-inhibiting film 20 is formed on each of the front and rear faces of the wafer 10.

Figure 2C:
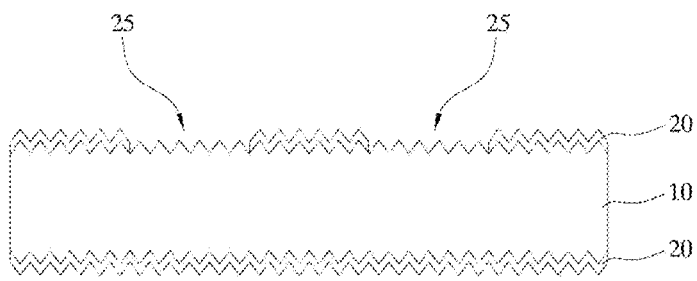

In step S 130, the front texturing-inhibiting film is patterned to expose a portion of the wafer. As shown in FIG. 2c, patterning the front texturing-inhibiting film may allow a portion of the wafer to be exposed. That is, a portion 25 of the front texturing-inhibiting film may be removed. Patterning of the texturing-inhibiting film may be performed with an acid solution, but is not limited to this method. Using this patterning process, the wafer will be exposed in a region where the texturing-inhibiting film is removed, and then the second surface unevenness will be formed in the region.

Figure 2D:
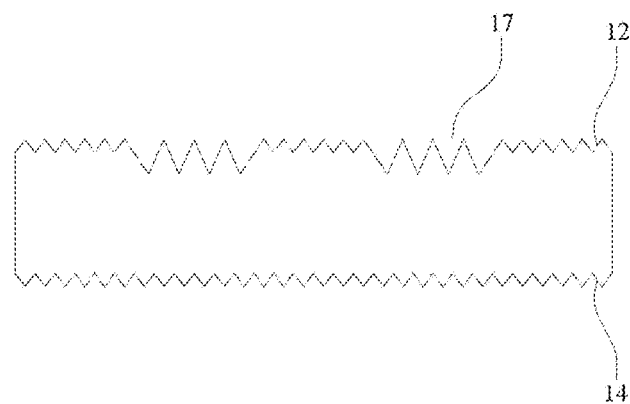

In step S 140, a second surface unevenness whose toughness is larger than that of the first surface unevenness is formed on the exposed portion of the wafer on which the texturing-inhibiting film is not formed. As shown in FIG. 2d, it may be seen that the second surface unevenness 17 is formed in the portion where the texturing-inhibiting film is removed. The unevenness may be formed by any one of plasma treatment for irradiating plasma, laser scribing to generate defects with adjusting energy levels, scratching forming scratches with fine tips, and acid or base treatment. The second surface unevenness is formed only in the portion where the texturing-inhibiting film is removed. The size of the unevenness of the second surface unevenness is larger and deeper than that of the first surface unevenness as shown in FIG. 2d. Therefore, the specific surface area of the portion where the second surface unevenness is formed will be smaller than the specific surface area of the portion where the first surface unevenness is formed. Thus, the second surface unevenness region exhibits high sheet resistance and the first surface unevenness region exhibits low sheet resistance.

In step S 150, the texturing-inhibiting film is removed. The removed state is shown in FIG. 2d. The texturing-inhibiting film may be removed using an acid solution. The acid solution may be used to remove the texturing-inhibiting films, surface metal ions, or an oxide film.

Figure 2E:
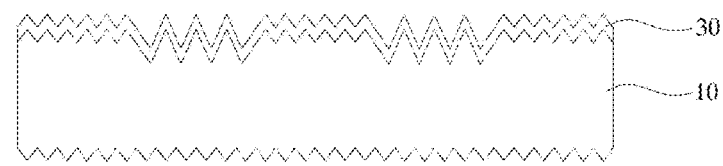

In step S 160, a selective emitter is formed on the front face of the wafer including the first surface unevenness and the second surface unevenness using a doping process. FIG. 2e shows a state in which the selective emitter layer 30 is formed. The step of forming the selective emitter is formed by implanting a conductive impurity having a conduction type opposite to that of the wafer.

When the silicon wafer 10 has n-type semiconductor properties, the emitter layer 30 may have p-type semiconductor properties. When the silicon wafer 10 has p-type semiconductor properties, the emitter layer 30 may have n-type semiconductor properties. When the emitter layer 30 has n-type semiconductor properties, the emitter layer 30 may be doped with pentavalent elements such as phosphorus (P), arsenic (As), antimony (Sb), and the like. When the emitter layer 30 has a p-type semiconductor characteristic, the emitter layer 30 may be doped with a trivalent element such as boron (B), gallium (Ga), indium (In) and the like.

According to the method as described above in accordance with the present disclosure, there may be provided a selective emitter in which there are no problems such as contamination and surface damage, loss of reflectivity, doping nonuniformity, etc. in a doping process, and, structurally over alignment and shadow losses for alignment of a front printed electrode are minimized.

Figure 3:
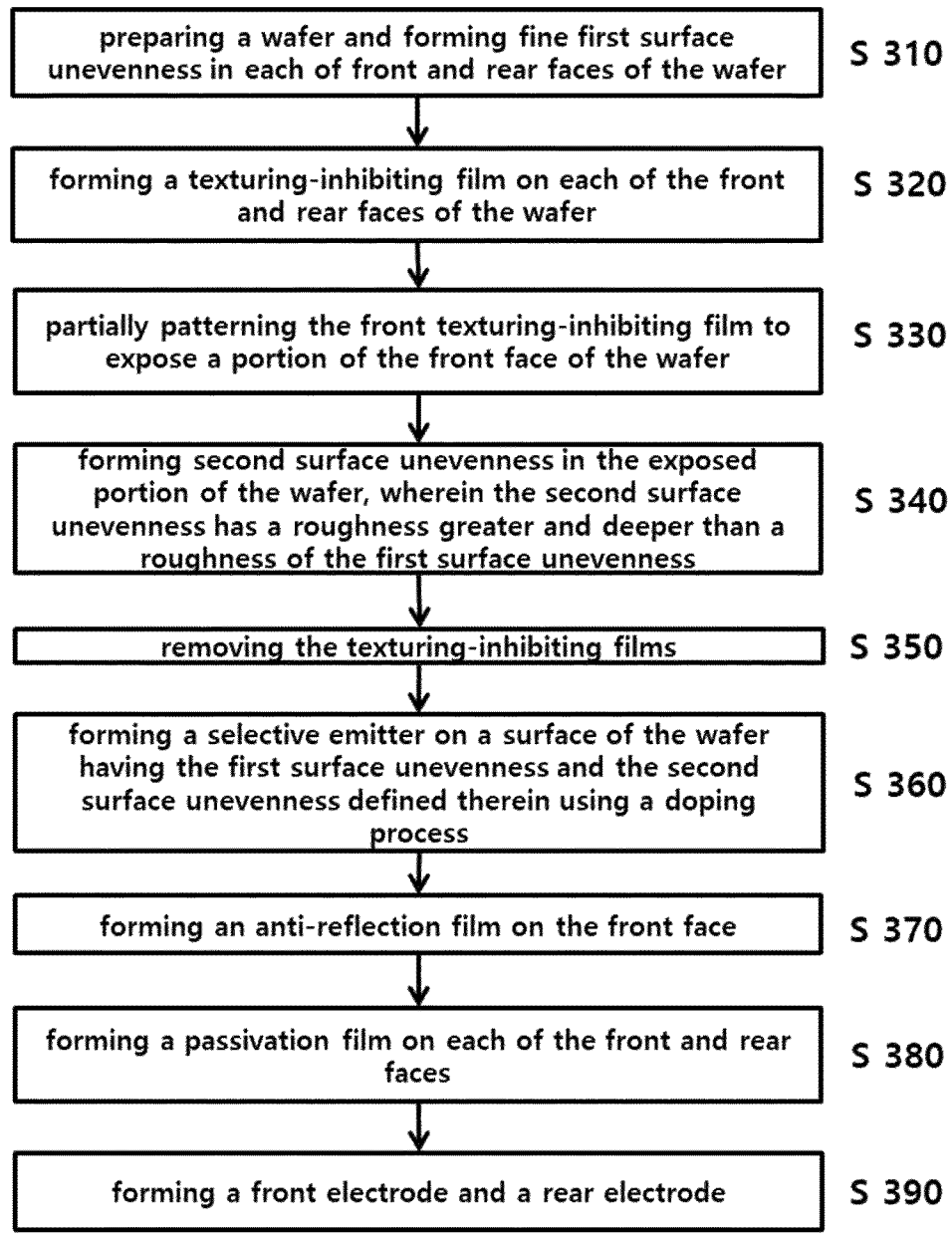
FIG. 3 shows a flowchart of a method of manufacturing a solar cell including a selective emitter using a surface structure according to an embodiment of the present disclosure.
Figure 4:
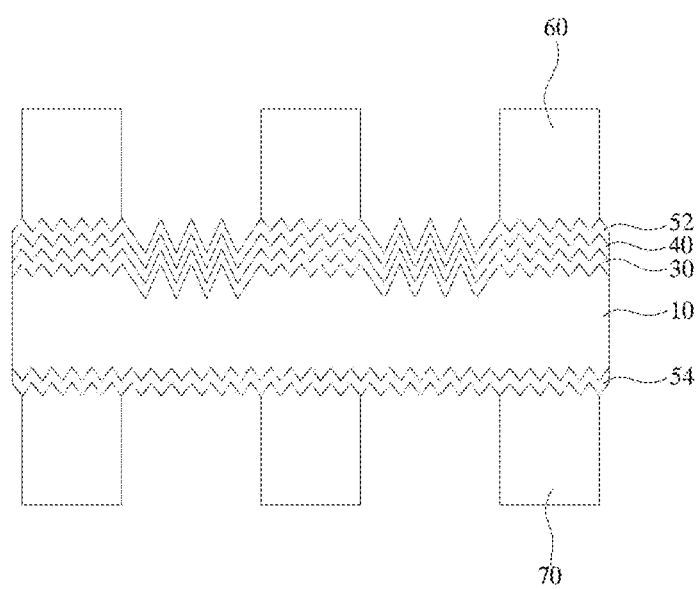
FIG. 4 shows a schematic diagram of a solar cell including a selective emitter using a surface structure according to an embodiment of the present disclosure.

FIG. 3 shows a flowchart of a method of manufacturing a solar cell including a selective emitter using a surface structure according to an embodiment of the present disclosure. FIG. 4 illustrates a schematic diagram of a solar cell including a selective emitter using a surface structure according to an embodiment of the present disclosure.

The method of manufacturing a solar cell including a selective emitter using a surface structure according to an embodiment of the present disclosure may include: exposing a wafer to chemical etching vapor to form fine first surface unevenness on the front and rear faces of the wafer (S 310); forming a texturing-inhibiting film on each of the front and rear faces of the wafer (S 320); patterning the front texturing-inhibiting film to expose a portion of the wafer (S 330); forming a second surface unevenness larger and deeper than the first surface unevenness on the exposed portion of the wafer on which the texturing-inhibiting film is not formed using an etching process (S 340); removing the texturing-inhibiting films (S 350); forming a selective emitter on the surface of the wafer including the first surface unevenness and the second surface unevenness (S 360) using a doping process; forming an anti-reflection film on the front face (S 370); forming a passivation film on each of the front and back surfaces (S 380); and forming a front electrode and a back electrode (S 390).

The steps S 310 to S 360 are overlapping with those already described in the description of FIG. 1. A following description starts from the step S 370.

In step S 370 to form an anti-reflection film on the front, as shown in FIG. 4, an anti-reflection film 40 may be placed. Silicon nitride (SiNx) may be used as the anti-reflection film, but is not limited thereto.

In S 380, front and rear passivation layers are formed. As shown in FIG. 4, the front passivation film 52 and the rear passivation film 54 may be disposed respectively. The front and/or back passivation films 52 and 54 may be formed of a dielectric material such as silicon oxide (SiOx), silicon nitride (SiNx), hydrogenated silicon nitride (SiNx:H), aluminum oxide (AlOx), silicon oxynitride (SiON) or hydrogenated silicon oxynitride (SiON:H), but may not be necessarily limited thereto.

In step S380, the front electrode and the rear electrode are disposed. As shown in FIG. 4, the front electrode 60 and the rear electrode 70 may be disposed respectively. Such an electrode may be formed of a conductive metal such as silver (Ag), copper (Cu), nickel (Ni), tin (Sn), zinc (Zn), indium (In), titanium (Ti), gold (Au), or the like.

The front electrode 60, as shown in FIG. 4 is disposed to contact the first surface unevenness.

According to the present disclosure, using the selective emitter (SE) technique, a low sheet resistance region (first unevenness region) and a high sheet resistance region (second unevenness region) are selectively formed. In the low sheet resistance region, FF is improved due to low contact resistance with the electrodes. In the area of high sheet resistance, due to the low surface recombination properties, JSC and VOC are improved. This improves solar cell efficiency.

In one example, although not shown, the method may further include forming a rear electric field layer on the rear surface. The rear face electric field layer is located on the back surface of the silicon wafer and may be formed of crystalline semiconductor material. For example, the rear face electric field layer may be formed of a single crystal or polycrystalline silicon material. In one example, the rear electric field layer may have the same semiconductor characteristics as the silicon substrate. In this case, in order to form a potential barrier between the silicon substrate and the rear face electric field layer, a concentration of the dopant doped in the rear face electric field layer may be higher than a dopant concentration doped in the silicon substrate.

The contents of the present disclosure have been described step by step. Hereinafter, the contents of the present disclosure will be further described along with specific examples. In the examples, experiments were carried out using a 6 inch boron doped p-type single crystal silicon wafer having a thickness of 180±20 μm and a resistivity of 1 to 1.5 Ωcm. To remove a cutting induced damage layer from the single crystal silicon wafer, the wafer was immersed in a mixed etching solution having a concentration of 5 wt % sodium hydroxide (NaOH) and 0.75 wt % sodium hypochlorite (NaOCl) at a process temperature of 75 to 80° C. for about 10 minutes. Then, the water was washed for 1 minute using room temperature DIW and then dried.

Present Example 1

In Present Example 1, the characteristics of the emitter were first observed when the first surface unevenness structure was formed, that is, the nanostructure was formed on the surface.

In order to form a uniform nanostructure on a front face of a wafer from which a cutting-induced damage layer is removed, $HF:HNO_3=7:3$ volumetric composition-based etching solution was vaporized. Then, a front face of a wafer was exposed to thus-formed chemical vapor for 10 minutes while a rear face thereof is bonded. Thus, uniform nanostructures were formed on the front surface. For changing a shape of the nanostructure of the surface, the wafer was etched by $HF:HNO_3:CH_3COOH=1:100:50$ isotropic etching solution at room temperature while varying an etching time to 1 minute, 2 minutes and 3 minutes.

The changed surface shape of the nanostructures was observed using scanning electron microscopy (SEM).

Then, to form a pyramid structure, a texturing-inhibiting film is formed on the nanostructure surface. Then, the wafer was etched for 30 minutes using an alkaline etching solution produced by mixing sodium hydroxide (NaOH) and isopropyl alcohol (IPA) with each other while a process temperature was maintained at 81 to 83° C. The texturing-inhibiting film formed on the nanostructure was removed by buffered hydrofluoric acid (BHF) with $NH_4F:HF=6:1$. Then, the wafer is was immersed in a mixed solution of 10 wt % hydrochloric acid (HCl) and 10 wt % hydrofluoric acid (HF) for 30 seconds to remove surface metal ions and oxide film, and then washed for 1 minute using DIW and then dried.

A diffusion process was performed at a temperature of 825° C. for 10 minutes in a quartz tube heat treatment furnace using $POCl_3$ to form an emitter layer on the surface of the clean and dried water. In order to remove a PSG (Phosphorus Silicate Glass) layer deposited on the surface, the wafer was immersed in hydrofluoric acid (HF) solution for 30 seconds, and then washed with DIW, and then dried. A sheet resistance of the emitter having the surface structure was measured using a four-points probe. In this connection, nine points having uniform separation distance were measured.

Figure 5:
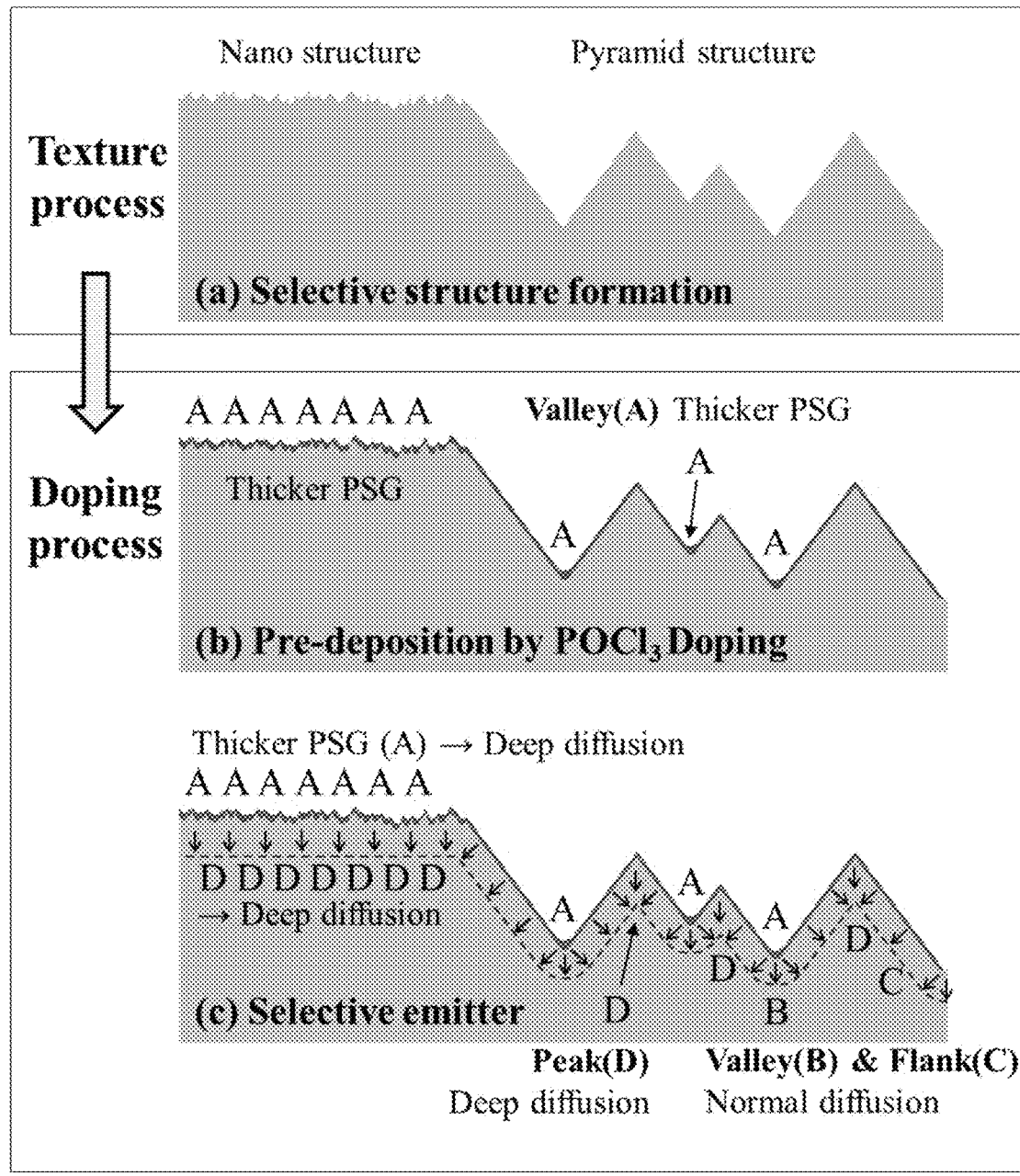
FIG. 5 is a schematic diagram of a method for forming a selective emitter using a surface structure according to Present Example 1.
Figure 6:
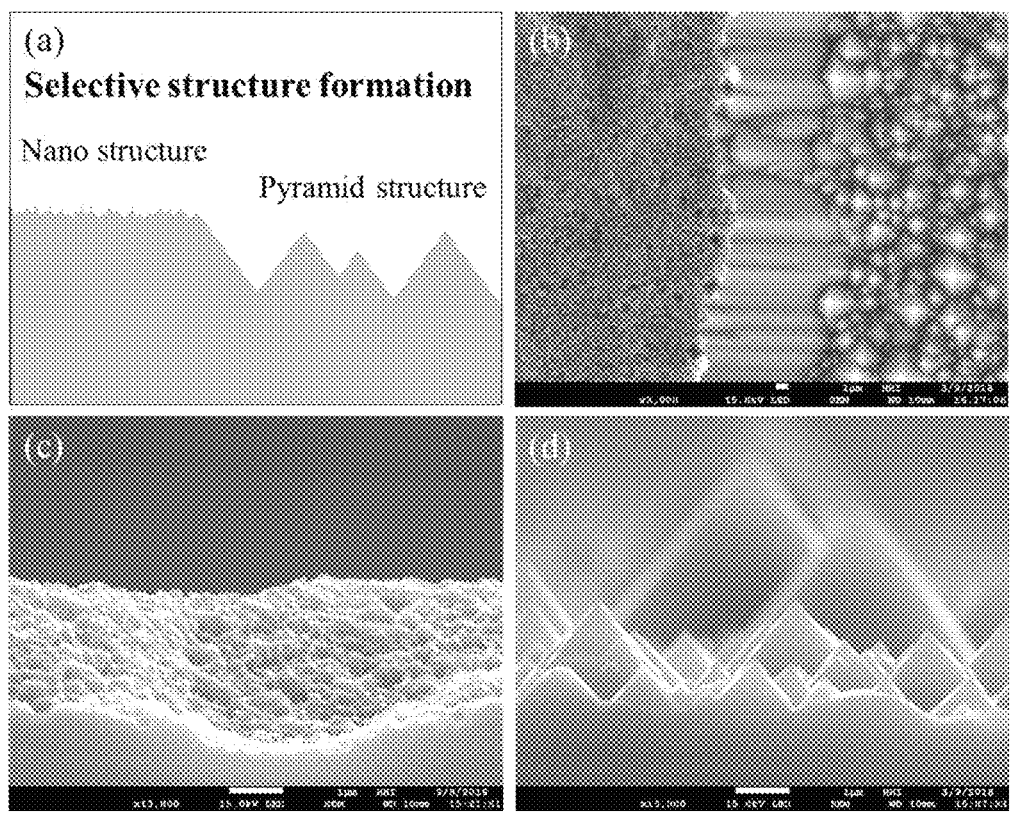
FIG. 6 shows a SEM image of the selective emitter as actually formed.

FIG. 5 is a schematic diagram of a method of forming a selective emitter using a surface structure according to Present Example 1. FIG. 6 shows a SEM image of the selective emitter as actually formed.

Figure 7:
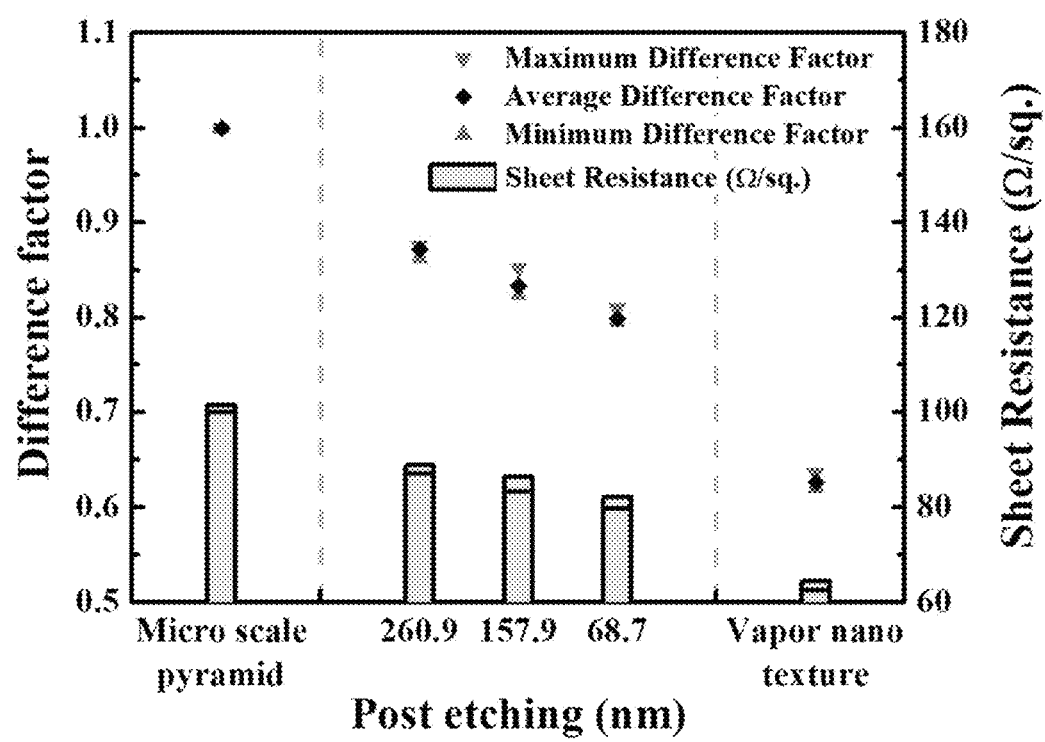
FIG. 7 shows change of a sheet resistance based on a surface shape.

FIG. 7 shows variation of a sheet resistance based on a surface geometry. As shown in FIG. 7, the sheet resistance was low in the fine nano unevenness such as the first surface unevenness. The sheet resistance value was larger in the second surface unevenness (named pyramid shaped unevenness) whose the roughness was larger and deeper than that of the first surface unevenness.

Present Example 2

In Present Example 2, a description of an embodiment of a method of actually manufacturing a solar cell according to the present disclosure is provided.

In order to form a uniform nanostructure on a front face of a wafer from which a cutting-induced damage layer is removed, $HF:HNO_3=7:3$ volumetric composition-based etching solution was vaporized. Then, a front face of a wafer was exposed to thus-formed chemical vapor for 10 minutes while a rear face thereof is bonded. Thus, uniform nanostructures were formed on the front surface.

Then, a texturing-inhibiting film was formed on each of the front and rear faces. Then, using a screen printing, the front texturing-inhibiting film was patterned to expose only a front light-absorbing region.

Then, a front surface structure having both nanostructures (first unevenness) and pyramid structure (second unevenness) was formed by alkaline texturing etching and texturing-inhibiting film removal. A surface shape of the patterned nanostructures and pyramid structures were observed using scanning electron microscopy (SEM).

The nano/pyramid structures-based sample, the nanostructure-only sample and the pyramid-structure only sample as patterned for the selective emitter were subjected to a diffusion process in a quartz tube heat treatment furnace using $POCl_3$ at a temperature of 830° C. for 10 minutes to form three sample emitters. Then, a PSG (Phosphorus Silicate Glass) layer deposited on the surface and the emitter layer deposited on the rear surface were etched using RENA-derived InOxide facility such that the front and rear bonding layer structures were isolated from the sample. In this connection, the emitter sheet resistance of the pyramid structure and the emitter sheet resistance of the nanostructure were 82 Ω/sq. And 62 Ω/sq respectively.

In order to form a standardized PERC structure, a front anti-reflection film of silicon nitride (SiNX) and rear passivation film of aluminum oxide ($Al_2O_3$) and silicon nitride (SiNX) were deposited using plasma-enhanced chemical vapor deposition (PECVD) system. The rear face was patterned into dotted lines at 0.7 mm spacings with laser ablation for forming a local Al-BSF. A metal junction structure of the solar cell is then formed. To this end, a silver paste (Ag, silver) and aluminum (Al, aluminum) paste for solar cell electrodes were formed on the rear and front faces using the screen printing process. After drying the pastes for 5 minutes in a process temperature of 150° C., the sample was fired in a four-zone conveyor belt furnace at 720, 550, 585, 855° C. to form the front and rear electrodes.

In order to evaluate printing characteristics of the front electrode as formed for each of the nano/pyramid structures-based sample, the nanostructure-only sample and the pyramid-structure only sample as patterned for the selective emitter, the printing shape of the electrode was observed with an optical microscope and a line width was measured.

Light I-V measurement of each solar cell as fabricated using each of the nano/pyramid structures-based sample, the nanostructure-only sample and the pyramid-structure only sample as patterned for the selective emitter was analyzed under 25 AM1.5G (100 mW/cm²) condition as a solar cell measurement standard. To analyze internal quantum efficiency of each solar cell as fabricated using each of the nano/pyramid structures-based sample, the nanostructure-only sample and the pyramid-structure only sample as patterned for the selective emitter, reflectance and quantum efficiency were measured in a wavelength range of 300 to 1100 nm using QEX7 as IPCE system.

Figure 8:
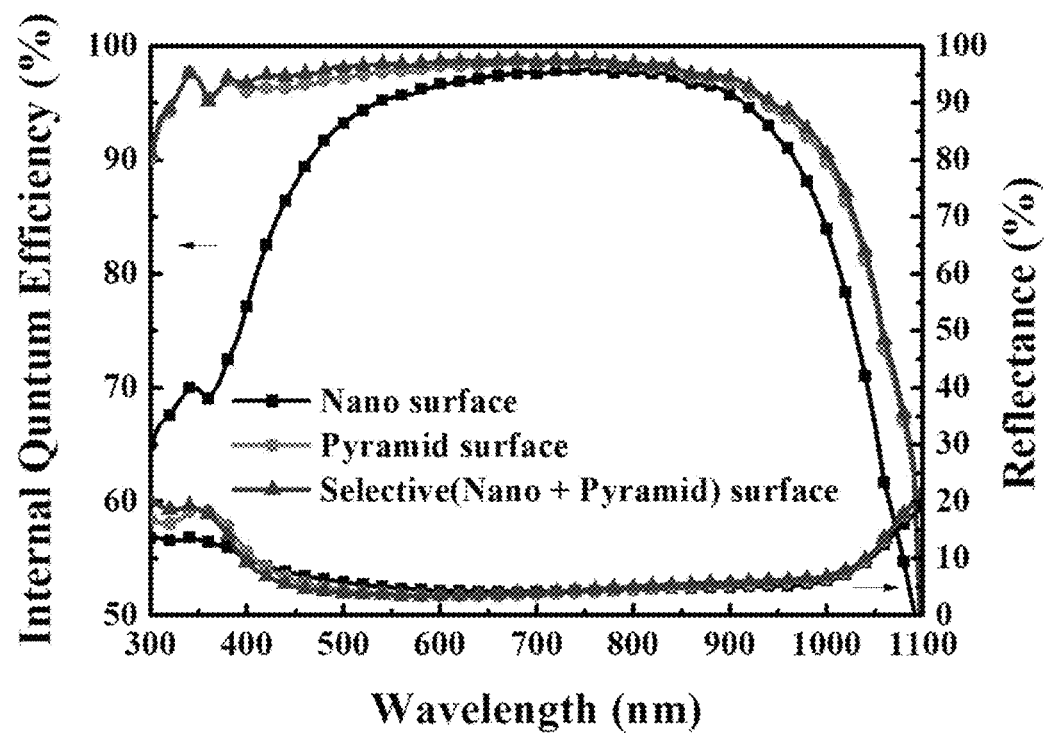
FIG. 8 shows reflectance and quantum efficiency results of the fabricated solar cell.

FIG. 8 shows the reflectance and quantum efficiency results of the fabricated solar cell. As shown in FIG. 8, the solar cell using the nano/pyramid structures-based sample according to the present disclosure showed high quantum efficiency even at a low wavelength.

The illustrations of the presented embodiments are provided so that a person of ordinary skill in the art of the present disclosure may use or implement the present disclosure. Various modifications to these embodiments will be readily apparent to those skilled in the art of the present disclosure. The general principles defined herein may be applied to other embodiments without departing from the scope of the present disclosure. Thus, the present disclosure is not to be construed as limited to the embodiments set forth herein but rather to be accorded the widest scope consistent with the principles and novel features set forth herein.

What is claimed is:

1. A method for manufacturing a selective emitter using a surface structure, the method includes:
    preparing a wafer;
    forming fine first surface unevenness in each of front and rear faces of the wafer;
    forming a texturing-inhibiting film on each of the front and rear faces of the wafer;
    patterning the texturing-inhibiting film to remove a portion of the texturing-inhibiting film and to expose a portion of the front face of the wafer;
    forming second surface unevenness in the exposed portion of the wafer, wherein the second surface unevenness has a roughness greater and deeper than a roughness of the first surface unevenness;
    removing the texturing-inhibiting film that remains on each of the front and rear faces of the wafer; and
    forming a selective emitter on a surface of the wafer having the first surface unevenness and the second surface unevenness defined therein using a doping process,
    wherein the forming of the first surface unevenness and the second surface unevenness reduces a loss of over alignment for alignment of a front electrode.

2. The method of claim 1, wherein forming the selective emitter includes implanting impurity ions having a conductive type different from a conductive type of the wafer.

3. The method of claim 1, wherein forming the first surface unevenness includes using at least one of plasma treatment, laser scribing, scratching, or acid or base treatment.

4. The method of claim 1, wherein forming the second surface unevenness includes using at least one of plasma treatment, laser scribing, scratching, or acid or base treatment.

5. A solar cell having a selective emitter, wherein the selective emitter is formed according to the method of claim 1.

6. A method for manufacturing a solar cell including a selective emitter using a surface structure, the method including:
    forming fine first surface unevenness on each of front and rear faces of the wafer;

forming a texturing-inhibiting film on each of the front and rear faces of the wafer;

patterning the texturing-inhibiting film to remove a portion of the texturing-inhibiting film and to expose a portion of the front face of the wafer;

forming second surface unevenness in the exposed portion of the wafer, wherein the second surface unevenness has a roughness greater and deeper than a roughness of the first surface unevenness;

removing the texturing-inhibiting film that remains on each of the front and rear faces of the wafer;

forming a selective emitter on a surface of the wafer having the first surface unevenness and the second surface unevenness defined therein using a doping process;

forming an anti-reflection film on the front face;

forming a passivation film on each of the front and rear faces; and forming a front electrode and a rear electrode, wherein the forming of the first surface unevenness and the second surface unevenness reduces a loss of over alignment for alignment of the front electrode.

7. The method of claim 6, wherein forming the selective emitter includes implanting impurity ions having a conductive type different from a conductive type of the wafer.

8. The method of claim 6, wherein forming the first surface unevenness includes using at least one of chemical etching treatment, plasma treatment, laser scribing, scratching, or acid or base treatment.

9. The method of claim 6, wherein forming the second surface unevenness includes using at least one of chemical etching treatment, plasma treatment, laser scribing, scratching, or acid or base treatment.

10. The method of claim 6, wherein the method further includes forming a rear electric field layer on the rear face.

11. The method of claim 6, wherein the front electrode contacts the first surface unevenness.

* * * * *